United States Patent
Park et al.

(10) Patent No.: US 8,241,979 B2
(45) Date of Patent: Aug. 14, 2012

(54) METHOD OF FORMING A VERTICAL DIODE AND METHOD OF MANUFACTURING A SEMICONDUCTOR DEVICE USING THE SAME

(75) Inventors: Sang-Jin Park, Gyeonggi-do (KR); Kong-Soo Lee, Gyeonggi-do (KR); Yong-Woo Hyung, Gyeonggi-do (KR); Young-Sub You, Gyeonggi-do (KR); Jae-Jong Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/805,825

(22) Filed: Aug. 20, 2010

(65) Prior Publication Data

US 2010/0323489 A1    Dec. 23, 2010

(51) Int. Cl.
*H01L 21/8234*    (2006.01)
(52) U.S. Cl. .............. 438/237; 438/95; 257/91
(58) Field of Classification Search .......... 257/104, 257/106, 536, 603; 438/237, 95, 910, 570, 438/575, 328
See application file for complete search history.

(56) References Cited

U.S. PATENT DOCUMENTS

| | | | | |
|---|---|---|---|---|
| 5,254,484 A | * | 10/1993 | Hefner et al. | 438/515 |
| 5,468,662 A | * | 11/1995 | Havemann | 438/151 |
| 5,691,212 A | * | 11/1997 | Tsai et al. | 438/297 |
| 5,854,102 A | * | 12/1998 | Gonzalez et al. | 438/237 |
| 5,891,208 A | * | 4/1999 | Gil | 55/482 |
| 6,727,122 B2 | * | 4/2004 | Seo et al. | 438/149 |
| 6,740,552 B2 | | 5/2004 | Gonzalez et al. | |
| 6,757,190 B2 | * | 6/2004 | Lowrey | 365/163 |
| 6,891,208 B2 | | 5/2005 | Leonardi | |
| 7,170,103 B2 | * | 1/2007 | Gonzalez et al. | 257/104 |

FOREIGN PATENT DOCUMENTS

| | | |
|---|---|---|
| KR | 10-0253029 | 1/2000 |
| KR | 10-20060094424 | 8/2006 |

* cited by examiner

*Primary Examiner* — Steven Loke
*Assistant Examiner* — David Goodwin
(74) *Attorney, Agent, or Firm* — Harness, Dickey & Pierce, P.L.C.

(57) ABSTRACT

A method of forming a vertical diode and a method of manufacturing a semiconductor device (e.g., a semiconductor memory device such as a phase-change memory device) includes forming an insulating structure having an opening on a substrate and filling the opening with an amorphous silicon layer. A metal silicide layer is formed to contact at least a portion of the amorphous silicon layer and a polysilicon layer is then formed in the opening by crystallizing the amorphous silicon layer using the metal silicide layer. A doped polysilicon layer is formed by implanting impurities into the polysilicon layer. Thus, the polysilicon layer is formed in the opening without performing a selective epitaxial growth (SEG) process, so that electrical characteristics of the diode may be improved.

7 Claims, 11 Drawing Sheets

METHOD OF FORMING A VERTICAL DIODE AND METHOD OF MANUFACTURING A SEMICONDUCTOR DEVICE USING THE SAME

CROSS-REFERENCE TO RELATED APPLICATION

This application claims priority under 35 U.S.C §119 U.S. application Ser. No. 12/034,440, filed Feb. 20, 2008 now U.S. Pat. No. 7,803,679, which claims priority under 35 U.S.C. §119 to Korean Patent Application No. 2007-17451, filed on Feb. 21, 2007, in the Korean Intellectual Property Office (KIPO), the contents of all of which are herein incorporated by reference in their entirety.

BACKGROUND

1. Field of Invention

Embodiments of the present invention relate to methods of forming a diode and methods of manufacturing a semiconductor device (e.g., a semiconductor memory device such as a phase-change memory device) using the same. More particularly, embodiments of the present invention relate to a method of forming a vertical diode in which a polysilicon layer may be formed at a relatively low temperature, and a method of manufacturing a semiconductor device using the same.

2. Description of the Related Art

Generally, semiconductor memory devices can be classified as either volatile semiconductor memory devices or non-volatile semiconductor memory devices. Volatile semiconductor memory devices include dynamic random access memory (DRAM) devices and static random access memory (SRAM) devices. Non-volatile semiconductor memory devices include flash memory devices and electrically erasable programmable read-only memory (EEPROM) devices. Flash memory devices are widely incorporated within electrical devices such as digital cameras, cellular phones, MPEG audio 3 players (MP3), etc. However, it may take a relatively long time to input/output data into/from a flash memory device. Accordingly, flash memory devices have been recently replaced with next generation semiconductor memory devices such as magnetoresistive random access memory (MRAM) devices, ferroelectric random access memory (FRAM) devices, phase-change random access memory (PRAM) devices, etc.

In a PRAM device, data may be input or output using a resistance difference between an amorphous state and a crystalline state of a phase-change material layer including a chalcogenide material, which may be generated by a phase transition of the phase-change material layer. For example, data having a value of "0" or "1" may be stored in the PRAM device using a reversible phase transition of the phase-change material layer in accordance with a width and a length of pulse applied thereto. The phase-change material layer may include a chalcogenide material such as germanium-antimony-tellurium (Ge—Sb—Te, GST). When a reset/set current is applied to a PRAM device, the reset/set current flows from a transistor through a lower electrode to a phase-change material layer. As a result, a phase transition may be generated in the phase-change material layer. The reset current changes the phase of the phase-change material layer from a crystalline state into an amorphous state while the set current changes the phase of the phase-change material layer from the amorphous state into the crystalline state. The phase-change material layer in the crystalline state may have a resistance lower than that of the phase-change material layer in the amorphous state.

Generally, a PRAM device includes a switching element connected to a word line, a lower electrode, an upper electrode and a phase-change material layer disposed between the lower electrode and the upper electrode. Usually, a transistor serves as the switching element. However, when the transistor is used as the switching element, the transistor may not have a driving current capacity greater than about 1 mA, which is required for a phase-transition of the phase-change material layer. Thus, research has been conducted to develop a vertical diode suitable for use as the switching element to replace the transistor. The vertical diode may be formed by implanting n-type impurities or p-type impurities into a polysilicon layer. For example, the vertical diode is formed by implanting n-type impurities into a lower portion of the polysilicon layer and p-type impurities into an upper portion thereof.

A selective epitaxial growth (SEG) process is generally performed in order to form a polysilicon layer. In the SEG process, after forming an insulation layer on a substrate, the insulation layer is partially removed to form an insulation layer pattern which has an opening therethrough exposing an active region of the substrate. The polysilicon layer is formed on the substrate using the exposed active region as a seed.

However, when the insulation layer is patterned to form the insulation layer pattern having the opening, the active region exposed by the opening may be damaged. Additionally, when the insulation layer has a multilayer structure in which different layers are stacked, an interface stress may be generated between adjacent layers in the multilayer structure. Due to the damage to the active region or the interface stress, it may not be easy to form a polysilicon layer having a gross grain size.

The polysilicon layer may be transformed from an amorphous silicon layer by performing a heat treatment process after forming the amorphous silicon layer in the opening. The amorphous silicon layer may be crystallized by the heat treatment process. However, the heat treatment process is usually performed at a temperature higher than about 600° C. As a result, the crystalline characteristics of the polysilicon layer may be inferior compared to the crystalline characteristics of a polysilicon layer formed by the SEG process. Thus, the polysilicon layer formed by the heat treatment process may have a relatively high internal resistance, and a driving current of about 1 mA may not flow through the polysilicon layer.

SUMMARY

Example embodiments of the present invention can be characterized as providing a method of forming a vertical diode ensuring a stable driving current.

Example embodiments of the present invention can also be characterized as providing a method of manufacturing a semiconductor device (e.g., a semiconductor memory device such as a phase-change memory device) using the method of forming the vertical diode ensuring the stable driving current.

One example embodiment described herein can be characterized as a method of forming a vertical diode, wherein the method includes forming an insulation structure having an opening therethrough on a substrate, the opening partially exposing the substrate; forming an amorphous silicon layer filling the opening; forming a metal silicide layer, wherein the metal silicide layer and the amorphous silicon layer contact each other; crystallizing the amorphous silicon layer using the metal silicide layer to form a polysilicon layer in the opening; and implanting impurities into the polysilicon layer to form a doped polysilicon layer.

Another example embodiment described herein can be characterized as a method of manufacturing a semiconductor memory device, wherein the method includes forming an insulation layer structure pattern having an opening there through on a substrate having a lower structure, the opening exposing a contact region of the lower structure; forming a metal layer on a sidewall of the opening; forming an amorphous silicon layer doped with first impurities, the amorphous silicon layer partially filling the opening; reacting a portion of the metal layer with the amorphous silicon layer to form a metal layer silicide layer; crystallizing the amorphous silicon layer using the metal silicide layer to form a polysilicon layer in the opening; implanting second impurities into the polysilicon layer to form a doped polysilicon layer in the opening, the second impurities having a type of conductivity different from that of the first impurities; and forming a lower electrode on the doped polysilicon layer.

Yet another example embodiment described herein can be characterized as a method of manufacturing a semiconductor device, wherein the method includes forming an insulation layer structure pattern having an opening therethrough on a substrate including a lower structure, the opening exposing a contact region of the lower structure; forming an amorphous silicon layer filling the opening; subjecting the amorphous silicon layer to a metal-induced-crystallization process to form a polysilicon layer in the opening; implanting impurities into the polysilicon layer to form a doped polysilicon layer in the opening; and forming a lower electrode on the doped polysilicon layer.

BRIEF DESCRIPTION OF THE DRAWINGS

The above and other features and advantages of embodiments of the present invention will become readily apparent by reference to the following detailed description when considered in conjunction with the accompanying drawings wherein.

DETAILED DESCRIPTION

Figure 1A:
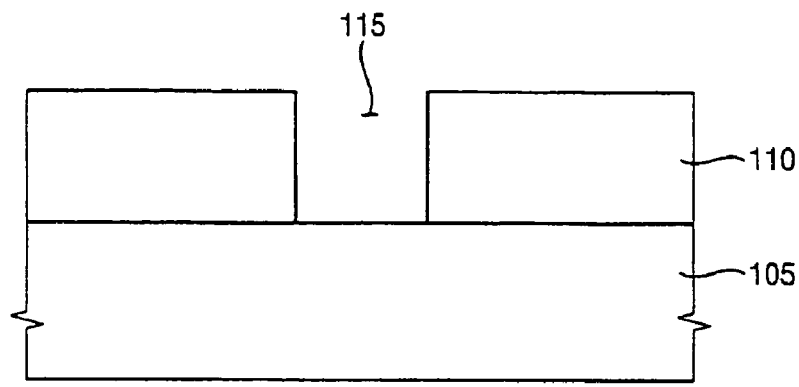
FIGS. 1A to 1E are cross-sectional views illustrating a method of forming a vertical 20 diode in accordance with some example embodiments of the present invention.

Example embodiments of the present invention are described more fully hereinafter with reference to the accompanying drawings. These example embodiments may, however, be realized in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on" or "connected to" another element or layer, it can be directly on, connected or coupled to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention as recited in the claims. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the 5 presence or addition of one or more other features, integers, steps, operations, elements, components, and/or groups thereof.

Example embodiments of the present invention are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention as recited in the claims.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A to 1E are cross-sectional views illustrating a method of forming a vertical diode in accordance with some example embodiments of the present invention.

Referring to FIG. 1A, an insulation layer structure (not shown) is formed on a substrate 105. The substrate 105 may include a semiconductor substrate, a metal oxide single crystalline substrate, or the like or a combination thereof. The insulation layer structure may, for example, include silicon oxide.

The insulation layer structure may be formed by a chemical vapor deposition (CVD) process, a low-pressure chemical vapor deposition (LPCVD) process, a plasma-enhanced chemical vapor deposition (PECVD) process, a high-density plasma chemical vapor deposition (HDP-CVD) process, or the like or a combination thereof.

In some example embodiments, the insulation layer structure may include an oxide layer, a nitride layer and/or a lower oxynitride layer. For example, the oxide layer may include phosphosilicate glass (PSG), borophosphosilicate glass (BPSG), undoped silicate glass (USG), tetraethyl orthosilicate (TEOS), plasma-enhanced tetraethyl orthosilicate (PE-TEOS), flowable oxide (FOx), HDP-CVD oxide, or the like or a combination thereof. The nitride layer may include silicon nitride or the like, and the oxynitride layer may include silicon oxynitride, titanium oxynitride, or the like or a combination thereof.

A top surface of the insulation layer structure may be planarized by a planarization process. For example, the planarization process may, for example, include a chemical mechanical polishing (CMP) process, an etch-back process, or a combination process of CMP and etch back.

Although not shown, first mask (e.g., a photoresist pattern) is formed on the insulation layer structure. The insulation layer structure is partially etched using the first mask as an etching mask to form an insulation layer structure pattern 110 on the substrate 105. Thus, an opening 115 may be formed through the insulation layer structure pattern 110 to partially expose the substrate 105. For example, the opening 115 may be formed by an anisotropic etching process. The first mask may be removed from the insulation layer structure pattern 110 by an ashing process and/or a stripping process, after the opening 115 is formed through the insulation 25 layer structure pattern 110.

Figure 1B:
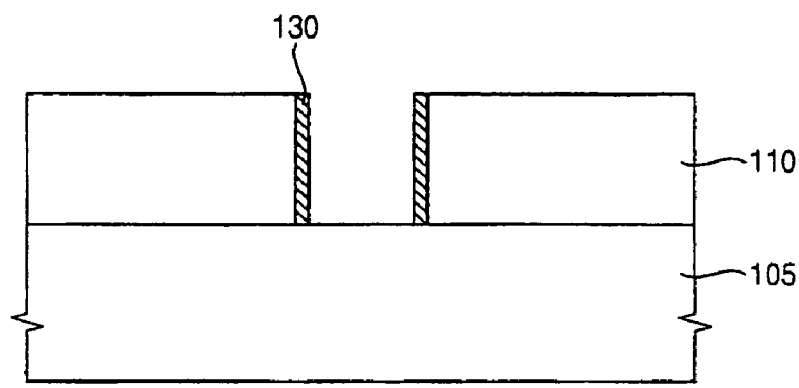

Referring to FIG. 1B, a metal layer (not shown) is formed on a bottom and a sidewall of the opening 115 and on the insulation layer structure pattern 110. For example, the metal layer may include nickel (Ni), palladium (Pd), titanium (Ti), copper (Cu), or the like. These may be used alone or in a combination thereof. The metal layer may be formed by, for example, a sputtering process, a CVD process, an LPCVD process, an electron beam deposition (EBD) process, a pulsed laser deposition (PLD) process, or the like or a combination thereof. The metal layer may be formed to have a thickness smaller than about 100 Å. When the metal layer has a thickness greater than about 100 Å, a leakage current through a metal silicide layer, which will be successively formed from the metal layer, may be undesirably increased.

The metal layer may be partially removed to form a metal layer pattern 130 on the 5 sidewall of the opening 115. For example, the metal layer pattern 130 may be formed by an anisotropic etching process.

Figure 1C:
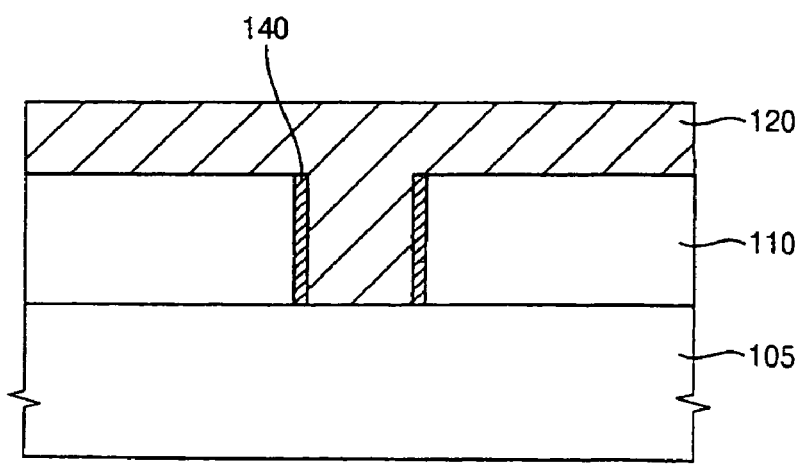

Referring to FIG. 1C, an amorphous silicon layer 120 may be formed on the substrate 105 and the insulation layer structure pattern 110 to fill the opening 115. For example, the amorphous silicon layer 120 may be formed by a CVD process, an LPCVD process, a PECVD 10 process, or the like or a combination thereof. When a silicon layer is formed on the substrate 105 by a selective epitaxial growth (SEG) process, defects may be generated in the silicon layer because the exposed portion of the substrate 105, serving as a seed layer, may have been damaged in the etching process for forming the insulation layer structure pattern 110. However, the amorphous silicon layer 120, in accordance with some example embodiments of the present invention, is formed by the CVD process, the LPCVD process or the PECVD process, or the like or a combination thereof. Therefore, defects may not be generated in the amorphous silicon layer 120.

In some example embodiments, the amorphous silicon layer 120 may include a first type of impurities. The first type of impurities may be implanted into the amorphous silicon layer 120. For example, the first type of impurities may include an element in Group V such as phosphorus (P), arsenic (As), antimony (Sb), or the like or a combination thereof. In some example embodiments, the metal layer pattern 130 is reacted with the amorphous silicon layer 120 making contact with the metal layer pattern 130. As a result, the metal layer pattern 130 may be transformed into a metal silicide layer pattern 140. For example, a silicidation process may be performed to transform the metal layer pattern 130 into the metal silicide layer pattern 140. In one embodiment, the silicidation process may be performed at a temperature of about 400° C. to about 500° C. In the silicidation process, metal atoms in the metal layer pattern 130 may be reacted with silicon atoms in the amorphous silicon layer 120 to transform the metal layer pattern 130 into the metal silicide layer pattern 140. The metal silicide layer pattern 140 on the sidewall of the opening 115 may have a large contact area with the amorphous silicon layer 120. As a result, a subsequent crystallization process may be effectively performed.

The amorphous silicon layer 120 may have a leakage current higher than that of a single crystalline silicon layer or a polysilicon layer. Thus, the crystallization process of the amorphous silicon layer 120 may be performed in order to reduce the leakage current, which is illustrated with reference to FIG. 1D.

Figure 1D:
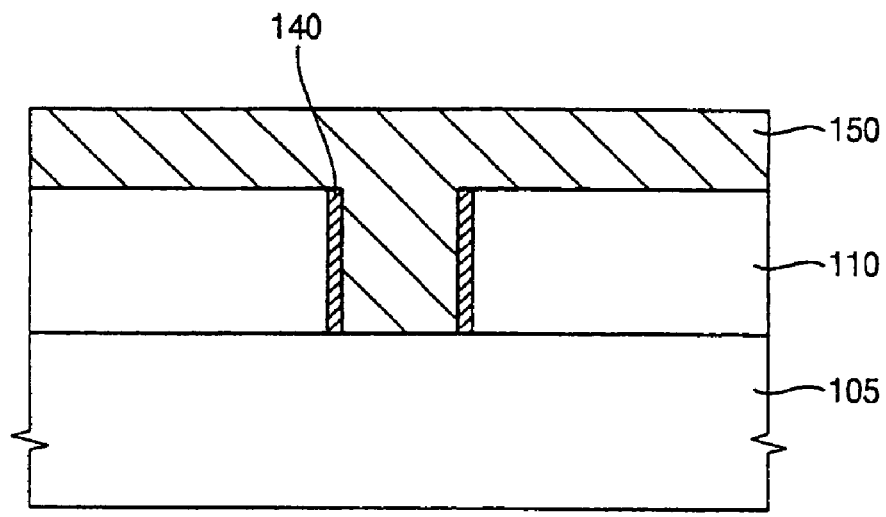

Referring to FIG. 1D, the amorphous silicon layer 120 may be crystallized to form a polysilicon layer 150. Thus, a leakage current may be reduced in a diode successively formed using the polysilicon layer 150. In one embodiment, the crystallization process may be facilitated by the metal silicide layer pattern 140 making contact with the amorphous silicon layer 120. That is, a metal-induced-crystallization (MIC) process of the amorphous silicon layer 120 may be performed due to the migration of silicide in the metal silicide layer pattern 140.

In some example embodiments, the crystallization process may include a heat treatment at a temperature of about 400° C. to about 500° C. The crystallization process is performed at a relatively low temperature such that a thermal budget for adjacent circuit elements may be reduced.

In some example embodiments, the crystallization process may include a heat treatment in a hydrogen atmosphere. Thus, dangling bonds and/or defects in the amorphous silicon layer 120 may be replaced with hydrogen atoms. As a result, defects may be decreased in the polysilicon layer 150, transformed from the amorphous silicon layer 120.

In some example embodiments, after transforming the metal layer pattern 130 into the metal silicide layer pattern 140, the amorphous silicon layer 120 is crystallized to form the polysilicon layer 150. The metal layer pattern 130 may be transformed into the metal silicide layer pattern 140 by performing a first heat treatment process on the metal layer pattern 130 at a first temperature. The amorphous silicon layer 120 may be crystallized to form the polysilicon layer 150 by performing a second heat treatment process on the amorphous silicon layer 120 at a second temperature. The second temperature may be higher than the first temperature. For example, the first temperature may be in a range of about 300° C. to about 400° C. and the second temperature may be in a range of about 450° C. to about 550° C.

Figure 1E:
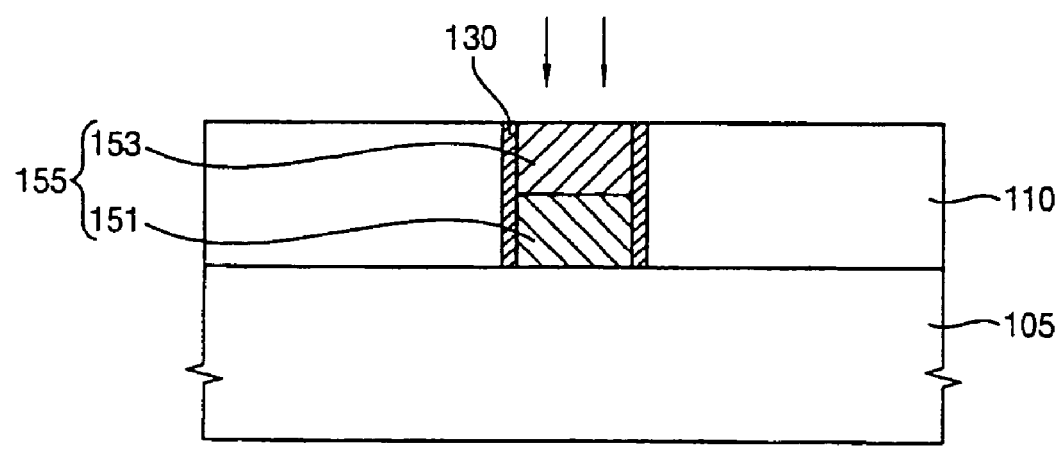

Referring to FIG. 1E, an upper portion of the polysilicon layer 150 may be planarized until the upper face of the insulation layer structure pattern 110 is exposed, thereby forming a polysilicon layer pattern filling the opening 115. The upper portion of the polysilicon layer 150 may be planarized by a CMP process, an etch-back process or a combination process of CMP and etch-back.

First impurities may be implanted into a lower portion of the polysilicon layer pattern to form a first semiconductor layer 151 and second impurities may be implanted into an upper portion of the polysilicon layer pattern to form a second semiconductor layer 153. Thus, a diode 155 including the first and second semiconductor layers 151 and 153 may be formed in the opening 115. In some example embodiments, the first and second impurities have different types of conductivity. In one embodiment, the first impurities may have an n-type of conductivity and the second impurities may have a p-type of conductivity. For example, the first impurities may include an element in Group V such as phosphorus (P), arsenic (As), antimony (Sb), or the like or a combination thereof, and the second impurities may include an element in Group III such as gallium (Ga), indium (In), thallium (Tl), or the like or a combination thereof. In another embodiment, the first impurities may have a p-type of conductivity and the second impurities may have an n-type of conductivity. In such an embodiment, the first impurities may include an element in Group III and the second impurities may include an element in Group V.

In some example embodiments, when the original polysilicon layer pattern includes impurities having a first type of conductivity, impurities having a second type of conductivity may be implanted into the upper portion or the lower portion of the polysilicon layer pattern by an ion implantation process to form the diode 155.

Figure 2A:
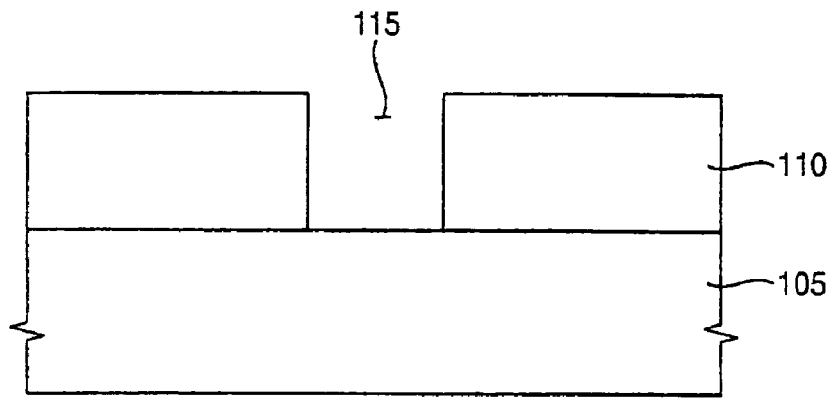
FIGS. 2A to 2E are cross-sectional views illustrating a method of forming a vertical diode in accordance with other example embodiments of the present invention.

FIGS. 2A to 2E are cross-sectional views illustrating a method of forming a vertical diode in accordance with other example embodiments of the present invention. Referring to FIG. 2A, an insulation layer structure pattern 110 having an opening 115 therethrough is formed on the substrate 105. The opening 115 may partially expose the substrate 105. A process for forming the insulation layer structure pattern 110 may be substantially the same as the process for forming the insulation layer structure pattern 110 in FIG. 1A. Thus, any further explanations will be omitted here.

Figure 2B:
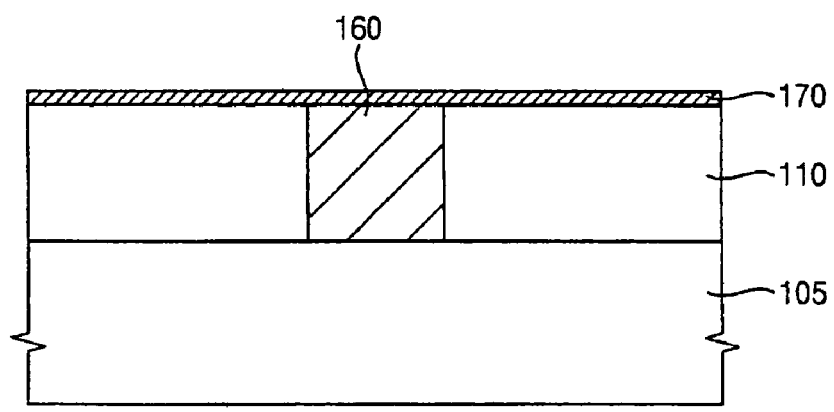

Referring to FIG. 2B, an amorphous silicon layer (not shown) is formed on the substrate 105 and the insulation layer structure pattern 110 to fill the opening 115. The amorphous silicon 30 layer is planarized until an upper face of the insulation layer structure pattern 110 is exposed, so that an amorphous silicon layer pattern 160 filling the opening 115 may be formed.

A metal layer 170 may be formed on the amorphous silicon layer pattern 160 and the insulation layer structure pattern 110. For example, the metal layer 170 may include nickel (Ni), palladium (Pd), titanium (Ti), copper (Cu), or the like. These may be used alone or in a combination thereof. The metal layer 170 may be formed by a sputtering process, a CVD process, an LPCVD process, an atomic layer deposition (ALD) process, an EBD process, a PLD process, or the like or a combination thereof. In an example embodiment, the metal layer 170 is formed to have a thickness smaller than about 100 A. When the metal layer 170 has a thickness greater than about 100 A, a leakage current through a metal silicide layer, which will be successively formed from the metal layer 170, may be undesirably increased.

Figure 2C:
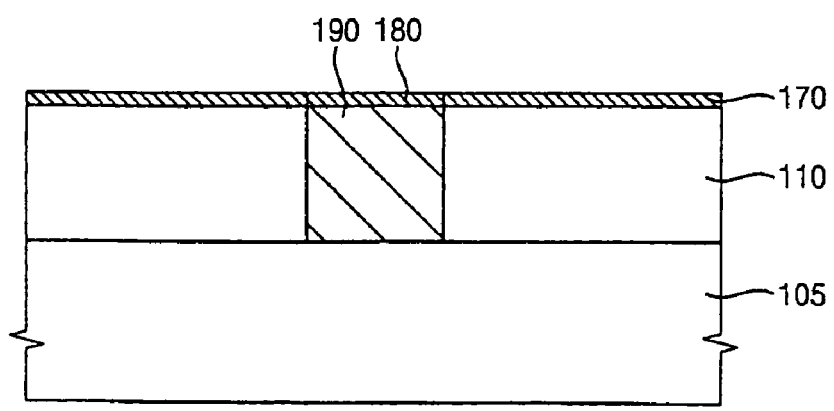

Referring to FIG. 2C, a portion of the metal layer 170 may be reacted with the amorphous silicon layer pattern 160 making contact with the metal layer 170, so as to be transformed into a metal silicide layer 180. For example, a silicidation process may be performed so that the metal layer 170 may be transformed into the metal silicide layer 180. In one embodiment, the silicidation process may be performed at a temperature of about 400° C. to about 500° C. In the silicidation process, metal atoms in the metal layer 170 may be reacted with silicon atoms in the amorphous silicon layer pattern 160 to transform a portion of the metal layer 170 into the metal silicide layer 180. The metal silicide layer 180 may be removed from the amorphous silicon layer pattern 160 and the insulation layer structure pattern 110 after a polysilicon layer 190 is formed using the metal silicide layer 180 in a subsequent process. Thus, the metal silicide layer 180 may be prevented from negatively affecting electrical characteristics of a vertical diode.

The amorphous silicon layer pattern 160 may be crystallized to form the polysilicon layer 190 filling the opening 115. For example, the crystallization process may be facilitated by the metal silicide layer 180 making contact with the amorphous silicon layer pattern 160. That is, a MIC process of the amorphous silicon layer pattern 160 may be performed due to the migration of silicide in the metal silicide layer 180.

In some example embodiments, the crystallization process may include a heat treatment at a temperature of about 400° C. to about 500° C. The crystallization process is performed at a relatively low temperature such that a thermal budget for adjacent circuit elements may be reduced.

In some example embodiments, the crystallization process may include a heat treatment in a hydrogen atmosphere. Thus, dangling bonds and/or defects in the amorphous silicon layer pattern 160 may be replaced with hydrogen atoms. As a result, defects may be decreased in the polysilicon layer 190, transformed from the amorphous silicon layer pattern 160.

In some example embodiments, after transforming the metal layer 170 into the metal silicide layer 180, the amorphous silicon layer pattern 160 is crystallized to form the polysilicon layer 190. The metal layer 170 may be transformed into the metal silicide layer 180 by performing a first heat treatment process on the metal layer 170 at a first temperature. The amorphous silicon layer pattern 160 may be crystallized to form the polysilicon layer 190 by performing a second heat treatment process on the amorphous silicon layer pattern 160 at a second temperature. The second temperature may be higher than the first temperature. For 10 example, the first temperature may be in a range of about 300° C. to about 400° C. and the second temperature may be in a range of about 450° C. to about 550° C.

Figure 2D:
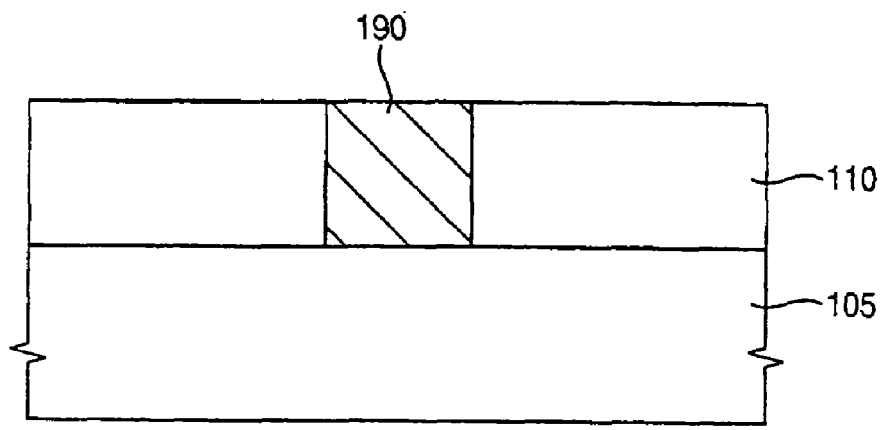

Referring to FIG. 2D, the metal silicide layer 180 may be removed from the insulation layer structure pattern 110 and the polysilicon layer 190. For example, the metal silicide layer 180 may be removed by a CMP process, an etch-back process or a combination process thereof.

Figure 2E:
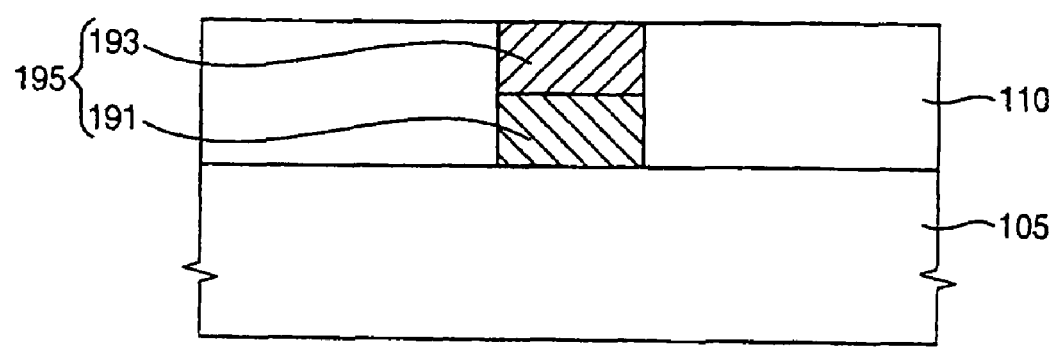

Referring to FIG. 2E, first impurities may be implanted into a lower portion of the polysilicon layer 190 to form a first semiconductor layer 191 and second impurities may be implanted into an upper portion of the polysilicon layer 190 to form a second semiconductor layer 193. Thus, a diode 195 including the first and second semiconductor layers 191 and 193 may be formed in the opening 115.

In some example embodiments, the first and second impurities have different types of conductivity. In one embodiment, the first impurities may have an n-type of conductivity and the second impurities may have a p-type of conductivity. For example, the first impurities may include an element in Group V such as phosphorus (P), arsenic (As), antimony (Sb), or the like or a combination thereof, and the second impurities may include an element in Group III such as gallium (Ga), indium (In), thallium (Tl), or the like or a combination thereof. In another embodiment, the first impurities may have a p-type conductivity and the second impurities may have an n-type conductivity. In such an embodiment, the first impurities may include an element in Group III and the second impurities may include an element in Group V.

In some example embodiments, when the original polysilicon layer 190 includes impurities having a first type of conductivity, impurities having a second type of conductivity may be implanted into the upper portion or the lower portion of the polysilicon layer 190 by an ion implantation process to form the diode 195.

FIGS. 3A to 3H are cross-sectional views illustrating a method of manufacturing a semiconductor device (e.g., a semiconductor memory device such as a phase-change memory device) in accordance with some example embodiments of the present invention.

Figure 3A:
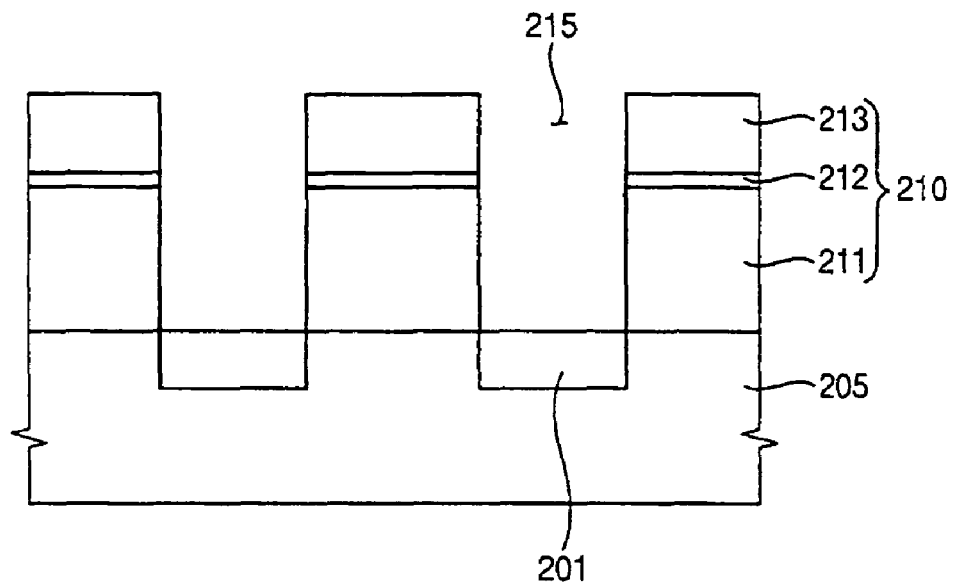
FIGS. 3A to 3H are cross-sectional views illustrating a method of manufacturing a semiconductor device in accordance with some example embodiments of the present invention.

Referring to FIG. 3A, an insulation layer structure (not shown) may be formed on a substrate 205 including a lower structure 201. The substrate 205 may include a semiconductor substrate, a metal oxide single crystalline substrate, or the like or a combination thereof. The lower structure 201 may include a word line, a contact region, a conductive pattern, an insulating pattern, a pad, a spacer, a gate structure, a transistor, or the like or a combination thereof.

In one example embodiment, the insulation layer structure may have a stacked structure. For example, the insulation layer structure may include a first insulation layer, a second insulation layer and a mold layer that are sequentially stacked.

The first insulation layer may include an oxide, and the second insulation layer may include a nitride and/or an oxynitride, or the like. The mold layer may, for example, include an oxide. The oxide layer and the mold layer may include silicon oxide such as PSG, BPSG, USG, spin-on glass (SOG), TEOS, PE-TEOS, FOX, HDP-CVD oxide, or the like or a combination thereof. The nitride layer may include silicon nitride, or the like, and the oxynitride layer may include silicon oxynitride, titanium oxynitride, or the like or a combination thereof.

The insulation layer structure may be formed by a CVD process, an LPCVD process, a PECVD process, a HDP-CVD process, or the like or a combination thereof. In another example embodiment, the insulation layer structure may have a single layer. For example, the insulation layer structure may be formed using an oxide such as silicon oxide, or the like.

An upper portion of the insulation layer structure may be planarized by a planarization process. For example, the planarization process may include a CMP process, an etch-back process, or a combination process thereof.

Although not shown, a first mask (e.g., a photoresist pattern) is formed on the insulation layer structure, and the insulation layer structure is partially etched using the first mask as an etching mask. Thus, an insulation layer structure pattern 210 having an opening 215 therethrough is formed on the substrate 205. The insulation layer structure pattern 210 may include a first insulation layer pattern 211, a second insulation layer pattern 212 and a mold layer pattern 213. The opening 215 may partially expose the substrate 205. For example, the opening 215 may be formed by an anisotropic etching process. The first mask may be removed from the insulation layer structure pattern 210 by an ashing process and/or a stripping process after the opening 215 is formed through the insulation layer structure pattern 210.

Figure 3B:
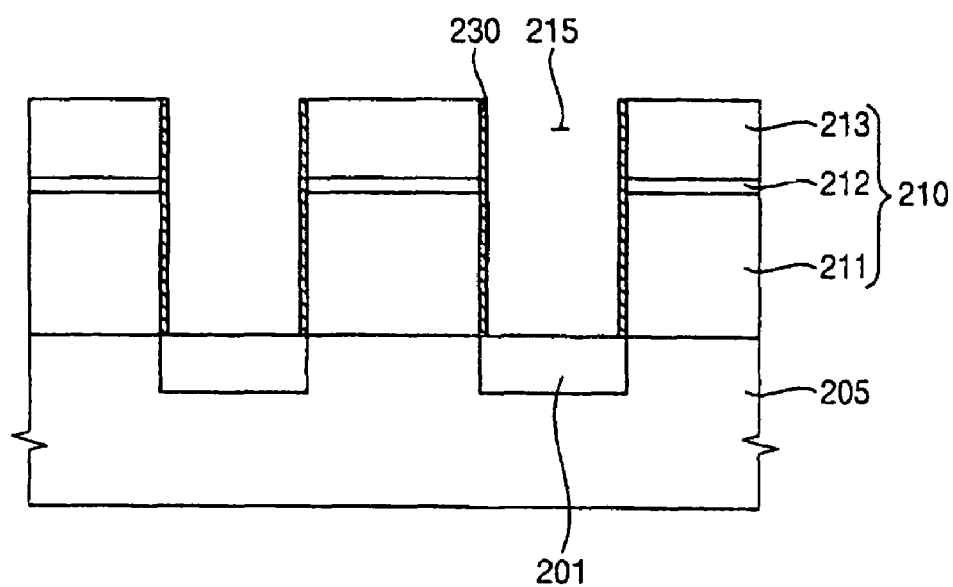

Referring to FIG. 3B, a metal layer (not shown) may be formed on the substrate 205 and the insulation layer structure pattern 210 to fill the opening 215. Thus, the metal layer may be formed on a bottom and a sidewall of the opening 215 and on the top surface of the insulation layer structure pattern 210. The metal layer may include nickel (Ni), palladium (Pd), titanium (Ti), copper (Cu), or the like or a combination thereof. The metal layer may be formed by a sputtering process, a CVD process, an LPCVD process, an EBD process, a PLD process, or the like or a combination thereof. In an example embodiment, the metal layer may be formed to have a thickness smaller than about 100 Å. When the metal layer has a thickness greater than about 100 Å, a leakage current through a metal silicide layer, which will be successively formed from the metal layer, may be undesirably increased.

The metal layer may be partially removed to form a metal layer pattern 230 on the sidewall of the opening 215. For example, the metal layer pattern 230 may be formed by an anisotropic etching process.

Figure 3C:
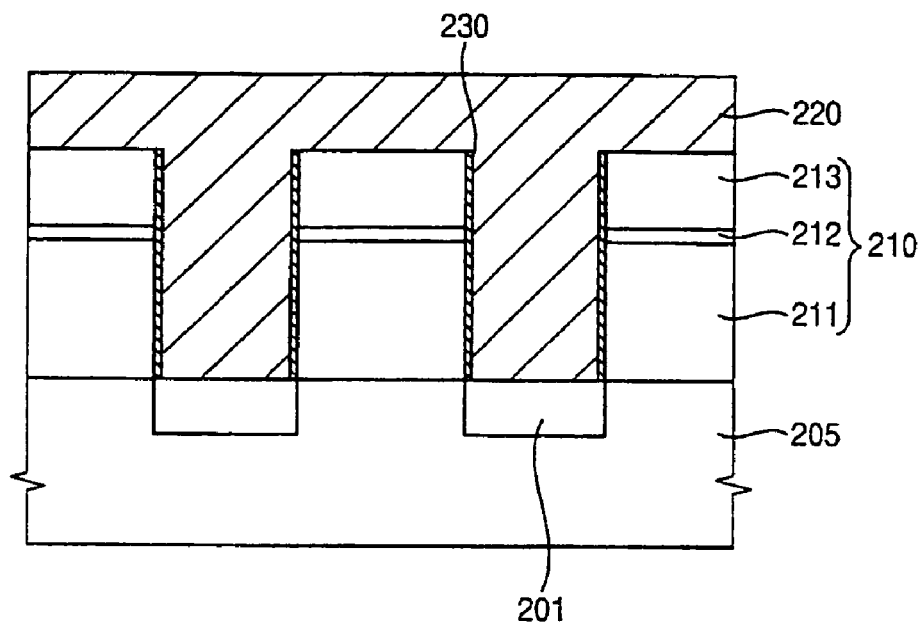

Referring to FIG. 3C, an amorphous silicon layer 220 may be formed on the substrate 20 205 and the insulation layer structure pattern 210 to fill the opening 215. For example, the amorphous silicon layer 220 may be formed by a CVD process, an LPCVD process, a PECVD process, or the like or a combination thereof. When a silicon layer is formed on the substrate 205 by a SEG process, defects may be generated in the silicon layer because the exposed portion of the substrate 205, serving as a seed layer, may have been damaged in the etching process for forming the insulation layer structure pattern 210. However, the amorphous silicon layer 220 in accordance with some example embodiments of the present invention is formed by the CVD process, the LPCVD process or the PECVD process or the like or a combination thereof. Therefore, defects may not be generated in the amorphous silicon layer 220.

In some example embodiments, the amorphous silicon layer 220 may include a first type of impurities. The first type of impurities may be implanted into the amorphous silicon layer 220. For example, the first type of impurities may include an element in Group V such as phosphorus (P), arsenic (As), antimony (Sb), or the like or a combination thereof.

In some example embodiments, the metal layer pattern 230 is reacted with the amorphous silicon layer 220 making contact with the metal layer pattern 230. As a result, the metal layer pattern 230 may be transformed into a metal silicide layer pattern 240. For example, a silicidation process may be performed to transform the metal layer pattern 230 into the metal silicide layer pattern 240. The silicidation process may be performed at a temperature of about 400° C. to about 500° C. In the silicidation process, metal atoms in the metal layer pattern 230 may be reacted with silicon atoms in the amorphous silicon layer 220 to transform the metal layer pattern 230 into the metal silicide layer pattern 240. The metal silicide layer pattern 240 on the sidewall of the opening 215 may have a large contact area with the amorphous silicon layer 220. As a result, a subsequent crystallization process may be effectively performed.

The amorphous silicon layer 220 may have a leakage current higher than that of a single crystalline silicon layer or a polysilicon layer. Thus, the crystallization process of the amorphous silicon layer 220 may be performed in order to reduce the leakage current.

Figure 3D:
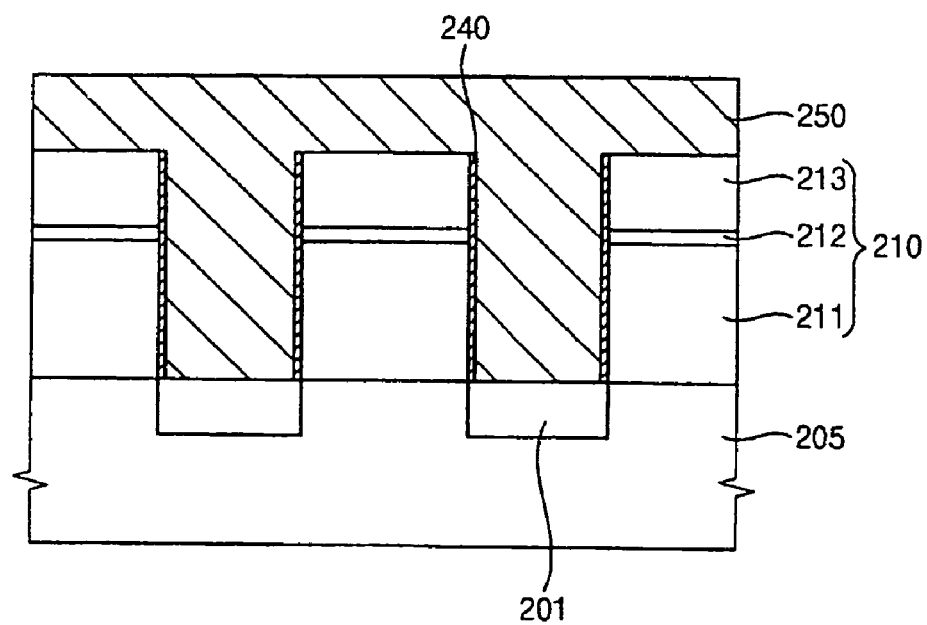

Referring to FIG. 3D, the amorphous silicon layer 220 may be crystallized to form a polysilicon layer 250. In one embodiment, a MIC process of the amorphous silicon layer 220 may be performed due to the migration of silicide in the metal silicide layer pattern 240. In some example embodiments, the crystallization process may include a heat treatment at a temperature of about 400° C. to about 500° C. The crystallization process is performed at a relatively low temperature such that a thermal budget for adjacent circuit elements may be reduced.

In some example embodiments, the crystallization process may include a heat treatment in a hydrogen atmosphere. Thus, dangling bonds and/or defects in the amorphous silicon layer 220 may be replaced with hydrogen atoms. As a result, defects may be decreased in the polysilicon layer 250, transformed from the amorphous silicon layer 220.

In some example embodiments, after transforming the metal layer pattern 230 into the metal silicide layer pattern 240, the amorphous silicon layer 220 is crystallized to form the polysilicon layer 250. The metal layer pattern 230 may be transformed into the metal silicide layer pattern 240 by performing a first heat treatment process on the metal layer pattern 230 at a first temperature. The amorphous silicon layer 220 may be crystallized to form the polysilicon layer 250 by performing a second heat treatment process on the amorphous silicon layer 220 at a second temperature. The second temperature may be higher than the first temperature. For example, the first temperature may be in a range of about 300° C. to about 400° C. and the second temperature may be in a range of about 450° C. to about 550° C.

Figure 3E:
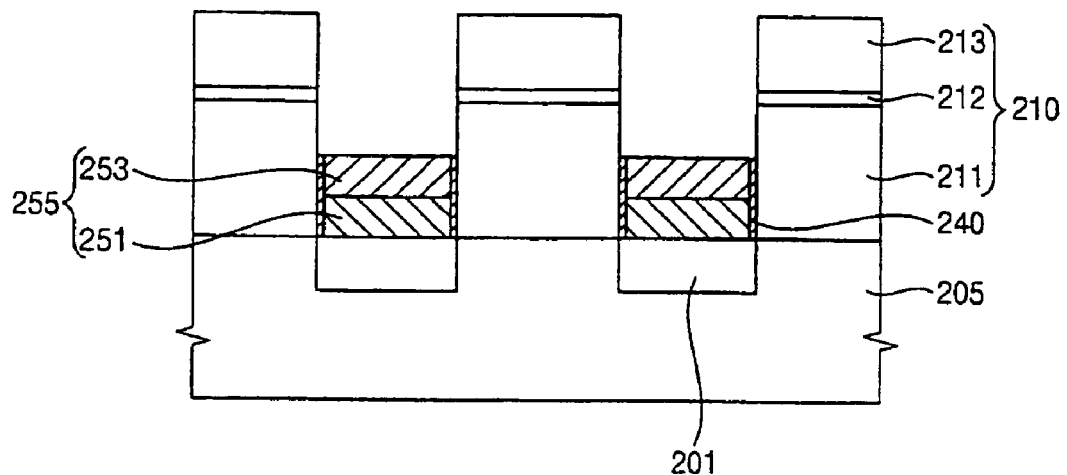

Referring to FIG. 3E, an upper portion of the polysilicon layer 250 may be removed, thereby forming a polysilicon layer pattern partially filling the opening 215. The polysilicon layer pattern may have an upper face lower than that of the second insulation layer pattern 212.

First impurities may be implanted into a lower portion of the polysilicon layer pattern to form a first semiconductor layer 251 and second impurities may be implanted into an upper portion of the polysilicon layer pattern to form a second semiconductor layer 253. Thus, a diode 255 including the first and second semiconductor layers 251 and 253 may be formed in the opening 215. In some example embodiments, the first and second impurities have different types of conductivity. In one embodiment, the first impurities may have an n-type of conductivity and the second impurities may have a p-type of conductivity. For example, the first impurities may include an element in Group V such as phosphorus (P), arsenic (As), antimony (Sb), or the like or a combination thereof, and the second impurities may include an element in Group III such as gallium (Ga), indium (In), thallium (Tl), or the like or a combination thereof. In another embodiment, the first impurities may have a p-type of conductivity and the second impurities may have an n-type of conductivity. In such an embodiment, the first impurities may include an element in Group III and the second impurities may include an element in Group V.

In some example embodiments, when the original polysilicon layer pattern includes impurities having a first type of conductivity, impurities having a second type of conductivity may be implanted into the upper portion or the lower portion of the polysilicon layer pattern by an ion implantation process to form the diode 255.

Figure 3F:
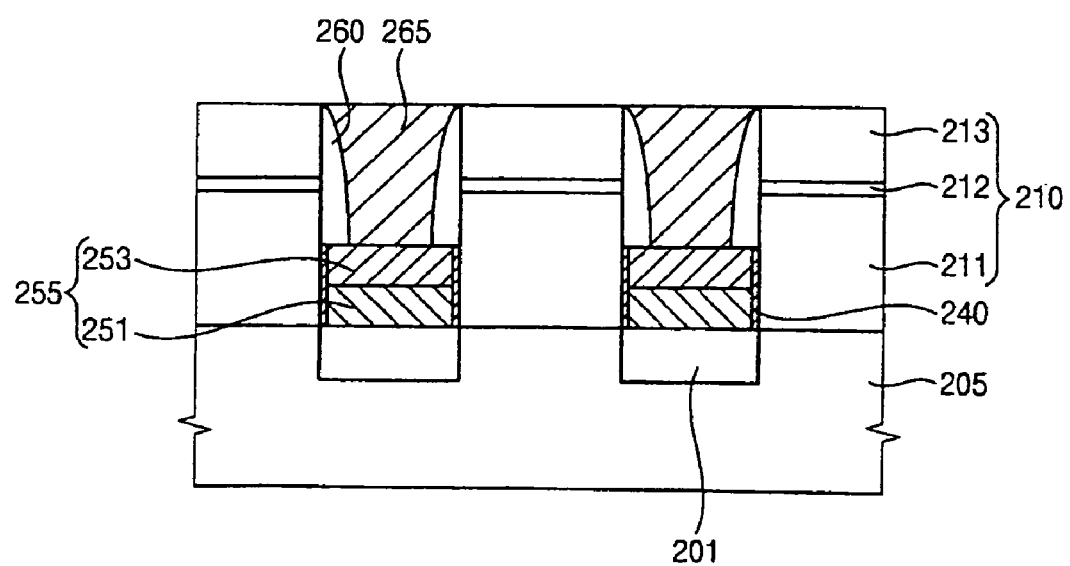

Referring to FIG. 3F, an insulation layer (not shown) may be formed on the second semiconductor layer 253, an upper sidewall of the opening 215 and the mold layer pattern 213. For example, the insulation layer may include a nitride.

The insulation layer may be partially etched by an anisotropic etching process to form a spacer 260 on the upper sidewall of the opening 215.

A first conductive layer (not shown) is formed on the diode 255, the spacer 260 and the mold layer pattern 213 to fill the remaining portion of the opening 215. The first conductive layer may include a metal, a metal nitride, or the like or a combination thereof. For example, the first conductive layer may include tungsten (W), titanium (Ti), titanium nitride (TiN), tantalum (Ta), tantalum nitride (TaN), molybdenum nitride (MoN), niobium nitride (NbN), titanium silicon nitride (TiSiN), aluminum (Al), titanium aluminum nitride (TiAlN), titanium boron nitride (TiBN), zirconium silicon nitride (ZrSiN), tungsten silicon nitride (WSiN), tungsten boron nitride, (WBN) zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), or the like or a combination thereof. In another embodiment, the first conductive layer may include polysilicon doped with impurities.

An upper portion of the first conductive layer may be planarized until an upper face of the mold layer pattern 213 is exposed to thereby form a preliminary lower electrode 265 filling the remaining portion of the opening 215. As a result, the preliminary lower electrode 265 may be self-aligned to the spacer 260.

Figure 3G:
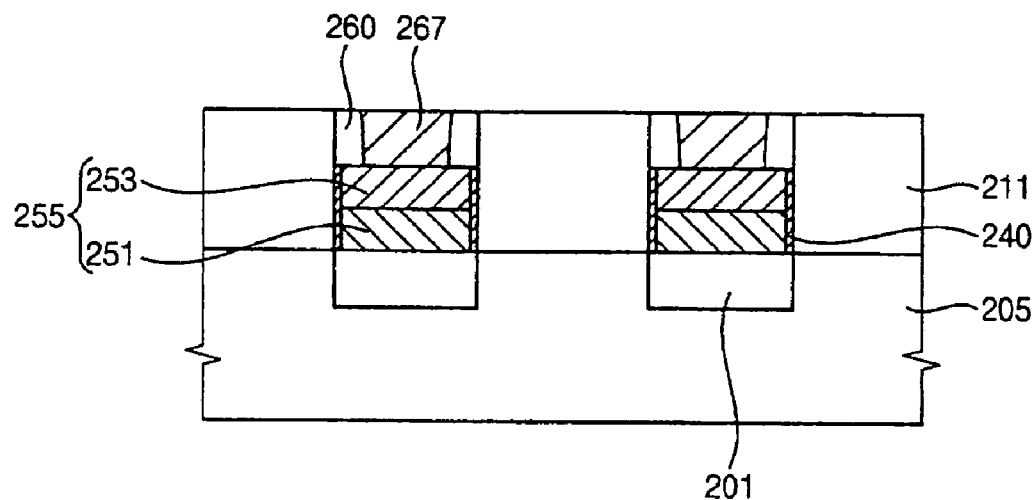

Referring to FIG. 3G, the mold layer pattern 213 and the second insulation layer pattern 212 are removed to expose the first insulation layer pattern 211. As a result, a lower electrode 267 may be formed on the diode 255.

Figure 3H:
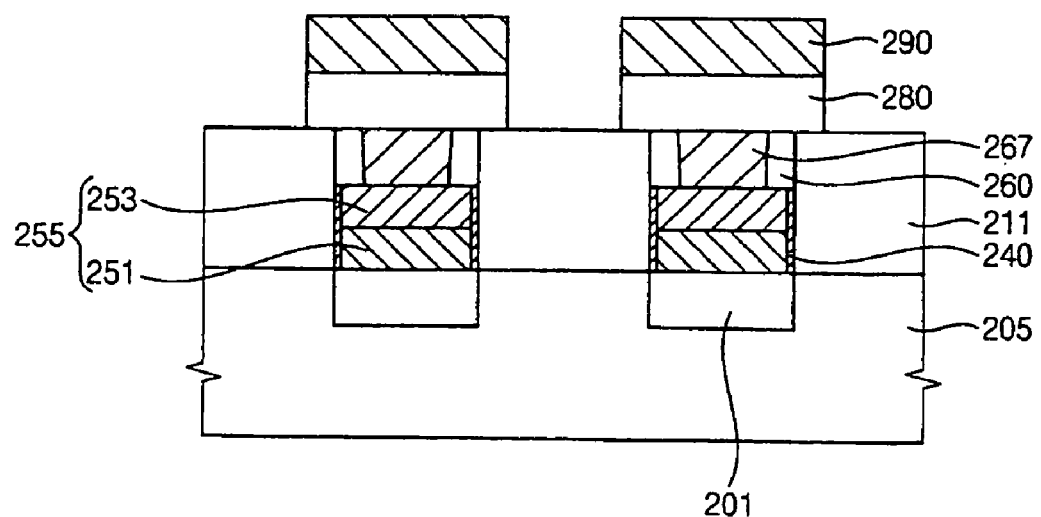

Referring to FIG. 3H, a phase-change material layer (not shown) is formed on the lower electrode 267. The phase-change material layer may include a chalcogenide material. For example, the chalcogenide material may include germanium-antimony-tellurium (Ge—Sb—Te), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), or an element of Group V-antimony-tellurium such as tantalum-antimony-tellurium (Ta—Sb—Te), niobium antimony-tellurium (Nb—Sb—Te) and vanadium antimony-tellurium (V—Sb—Te). In another embodiment, the chalcogenide material may include an element of Group Vi-antimony-25 tellurium such as tungsten-antimony-tellurium (W—Sb—Te), molybdenum-antimony-tellurium (Mo—Sb—Te) and chromium-antimony-tellurium (Cr—Sb—Te). In another embodiment, the chalcogenide material may include an element of Group V-antimony-selenium or an element of Group VI-antimony-selenium.

A second conductive layer may be formed on the phase-change material layer. The second conductive layer may include a metal, a metal nitride, or the like or a combination thereof. For example, the second conductive layer may include tungsten (W), titanium (Ti), titanium nitride (TiN), tantalum (Ta), tantalum nitride (TaN), molybdenum nitride (MoN), niobium nitride (NbN), titanium silicon nitride (TiSiN), aluminum (Al), titanium aluminum nitride (TiAlN), titanium boron nitride (TiBN), zirconium silicon nitride (ZrSiN), tungsten silicon nitride (WSiN), tungsten boron nitride, (WBN) zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), or the like or a combination thereof. In another embodiment, the second conductive layer may include polysilicon doped with impurities.

A second mask (not shown) may be formed on the second conductive layer. The second conductive layer and the phase-change material layer may be partially etched using the second mask as an etching mask to form an upper electrode 290 and a phase-change material layer pattern 280, respectively, on the lower electrode 267. Accordingly, the lower electrode 267, the phase-change material layer pattern 280 and the upper electrode 290 may be sequentially formed on a switching device to thereby manufacture a phase-change memory device.

FIGS. 4A to 4E are cross-sectional views illustrating a method of manufacturing a semiconductor device (e.g., a semiconductor memory device such as a phase-change memory device) in accordance with other example embodiments of the present invention.

Figure 4A:
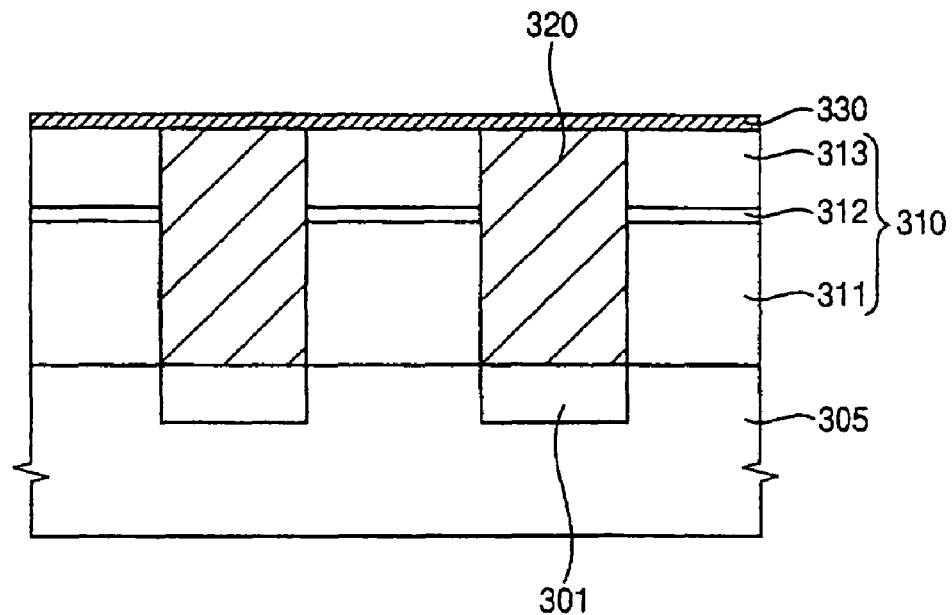
FIGS. 4A to 4E are cross-sectional views illustrating a method of manufacturing a semiconductor device in accordance with other example embodiments of the present invention.

Referring to FIG. 4A, an insulation layer structure pattern 310 having an opening therethrough is formed on the substrate 305 (e.g., in a manner similar to that discussed with respect to FIG. 3A). The opening may partially expose the substrate 305. The insulation layer structure pattern 310 may include a first insulation layer pattern 311, a second insulation layer pattern 312 and a mold layer pattern 313 that are sequentially stacked on the substrate 305. After forming an amorphous silicon layer pattern 320 in the opening (e.g., in a manner similar to that discussed with respect to FIG. 2B), a metal layer 330 may be formed on the amorphous silicon layer pattern 320 and the mold layer pattern 313. For example, the metal layer 330 may be formed using nickel (Ni), palladium (Pd), titanium (Ti), copper (Cu), or the like. These may be used alone or in a combination thereof. The metal layer 330 may be formed by a sputtering process, a CVD process, an LPCVD process, an EBD process, a PLD process, or the like or a combination thereof.

Figure 4B:
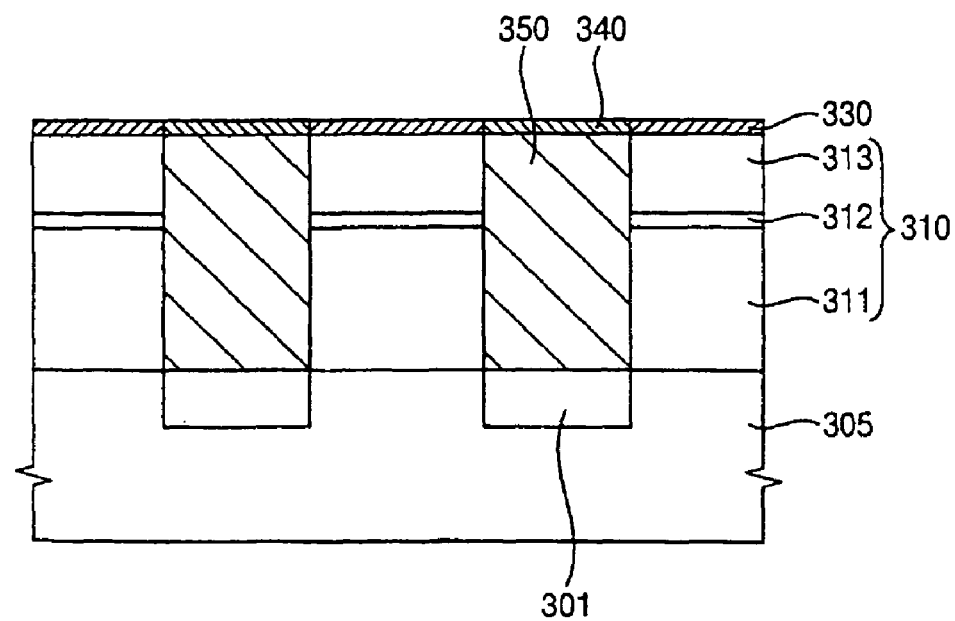

Referring to FIG. 4B, the metal layer 330 may be reacted with the amorphous silicon layer pattern 320 making contact with the metal layer 330, so as to be transformed into a metal silicide layer 340. For example, a silicidation process may be performed so that the metal layer 330 may be transformed into the metal silicide layer 340. The silicidation process may be performed at a temperature of about 400° C. to about 500° C. In the silicidation process, metal atoms in the metal layer 330 may be reacted with silicon atoms in the amorphous silicon layer pattern 320 to transform the metal layer 330 into the metal silicide layer 340.

The amorphous silicon layer pattern 320 may be crystallized to form the polysilicon layer 350 filling the opening. For example, the crystallization process may be facilitated by the metal silicide layer 340 making contact with the amorphous silicon layer pattern 320. That is, a MIC process of the amorphous silicon layer pattern 320 may be performed due to the migration of silicide in the metal silicide layer 340.

In some example embodiments, the crystallization process may include a heat treatment at a temperature of about 400° C. to about 500° C. The crystallization process is performed at a relatively low temperature such that a thermal budget for adjacent circuit elements may be reduced.

In some example embodiments, the crystallization process may include a heat treatment in a hydrogen atmosphere. Thus, dangling bonds and/or defects in the amorphous silicon layer pattern 320 may be replaced with hydrogen atoms. As a result, defects may be decreased in the polysilicon layer 350, transformed from the amorphous silicon layer pattern 320.

In some example embodiments, after transforming the metal layer 330 into the metal silicide layer 340 followed by crystallizing the amorphous silicon layer pattern 320 to form the polysilicon layer 350. The metal layer 330 may be transformed into the metal silicide layer 340 by performing a first heat treatment process on the metal layer 330 at a first temperature. The amorphous silicon layer pattern 320 may be crystallized to form the polysilicon layer 350 by performing a second heat treatment process on the amorphous silicon layer pattern 320 at a second temperature. The second temperature may be higher than the first temperature. For example, the first temperature may be in a range of about 300° C. to about 400° C. and the second temperature may be in a range of about 450° C. to about 550° C.

Figure 4C:
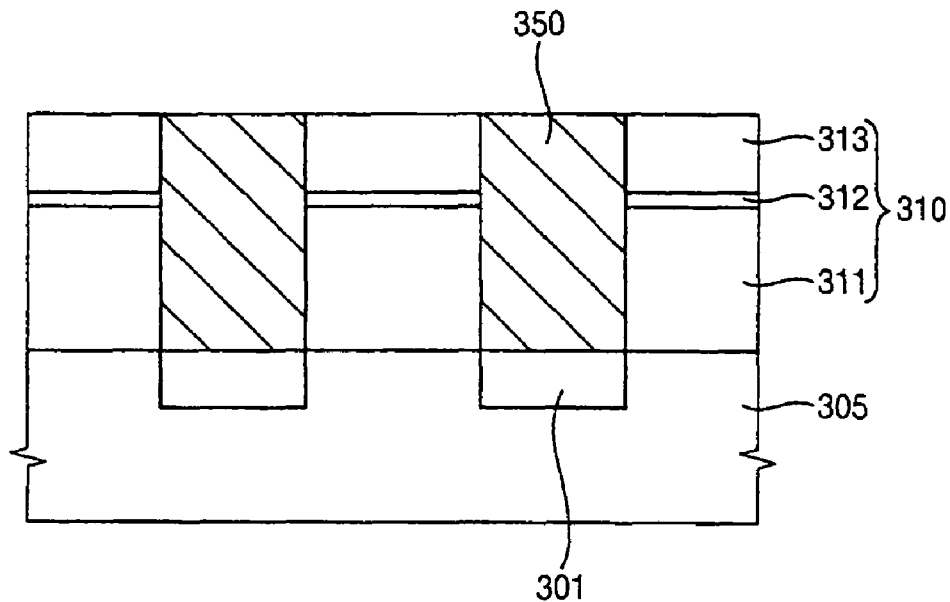
Figure 4D:
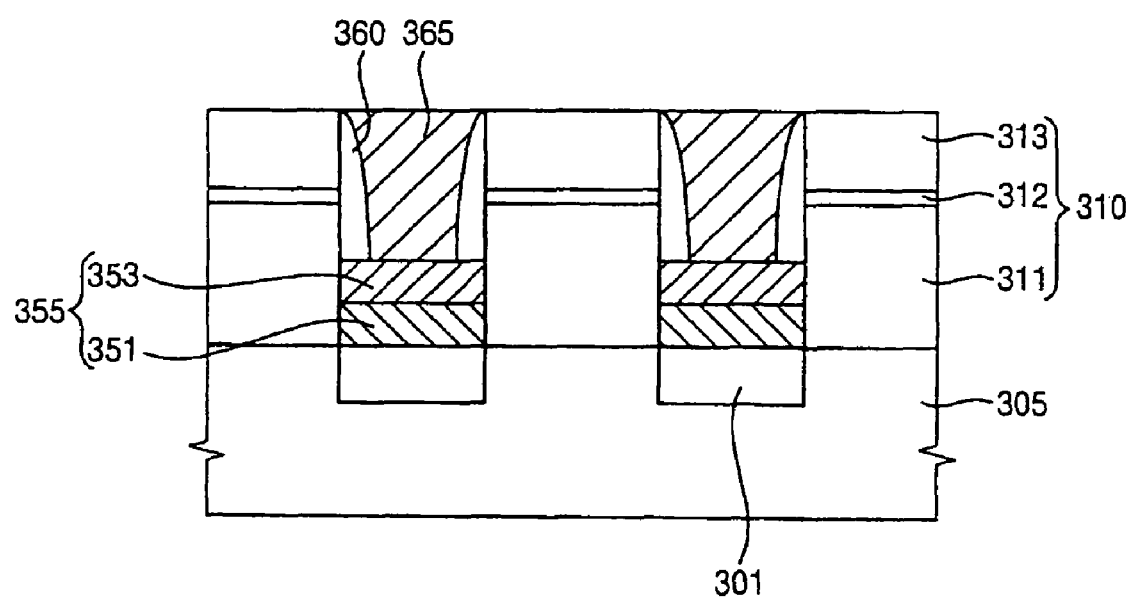

Referring to FIG. 4C, the metal layer 330 and the metal silicide layer 340 may be removed. For example, the metal layer 330 and the metal silicide layer 340 may be removed by a CMP process, an etch-back process or a combination process thereof. Referring to FIG. 4D, an upper portion of the polysilicon layer 350 may be removed, thereby forming a polysilicon layer pattern partially filling the opening. The polysilicon layer pattern may have an upper face lower than that of the second insulation layer pattern 312.

First impurities may be implanted into a lower portion of the polysilicon layer pattern to form a first semiconductor layer 351 and second impurities may be implanted into an upper portion of the polysilicon layer pattern to form a second semiconductor layer 353. Thus, a diode 355 including the first and second semiconductor layers 351 and 353 may be formed in the opening. In some example embodiments, the first and second impurities have different types of conductivity. In one embodiment, the first impurities may have an n-type of conductivity and the second impurities may have a p-type of conductivity. For example, the first impurities may include an element in Group V such as phosphorus (P), arsenic (As), antimony (Sb), or the like or a combination thereof, and the second impurities may include an element in Group III such as gallium (Ga), indium (In), thallium (Tl), or the like or a combination thereof. In another embodiment, the first impurities may have a p-type of conductivity and the second impurities may have an n-type of conductivity. In such an embodiment, the first impurities may include an element in Group III and the second impurities may include an element in Group V.

In some example embodiments, when the original polysilicon layer pattern includes impurities having a first type of conductivity, impurities having a second type of conductivity may be implanted into the upper portion or the lower portion of the polysilicon layer pattern by an ion implantation process to form the diode 355.

An insulation layer (not shown) may be formed on the second semiconductor layer 353, an upper sidewall of the opening and the mold layer pattern 313. For example, the insulation layer may include a nitride.

The insulation layer may be partially etched by an anisotropic etching process to form a spacer 360 on the upper sidewall of the opening.

A first conductive layer (not shown) is formed on the diode 355, the spacer 360 and the mold layer pattern 313 to fill the remaining portion of the opening. The first conductive layer may include a metal, a metal nitride, or the like or a combination thereof. For example, the first conductive layer may be formed using tungsten (W), titanium (Ti), titanium nitride (TiN), tantalum (Ta), tantalum nitride (TaN), molybdenum nitride (MoN), niobium nitride (NbN), titanium silicon nitride (TiSiN), aluminum (Al), titanium aluminum nitride (TiAlN), titanium boron nitride (TiBN), zirconium silicon nitride (ZrSiN), tungsten silicon nitride (WSiN), tungsten boron nitride, (WBN) zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), or the like or a combination thereof. In another embodiment, the first conductive layer may include polysilicon doped with impurities.

An upper portion of the first conductive layer may be planarized until an upper face of the mold layer pattern 313 is exposed to thereby form a preliminary lower electrode 365 filling the remaining portion of the opening. As a result, the preliminary lower electrode 365 may be self-aligned to the spacer 360.

Figure 4E:
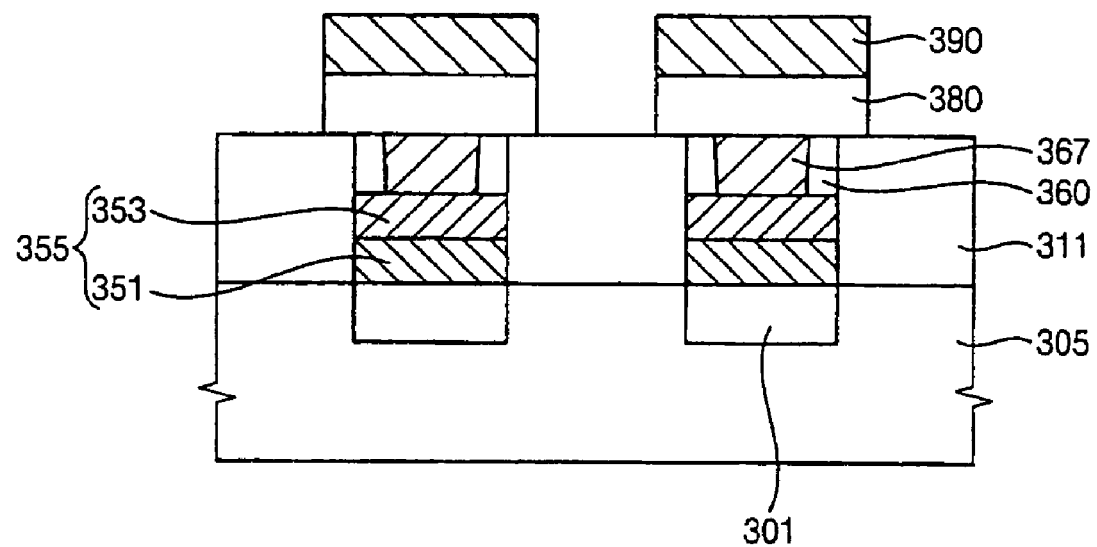

Referring to FIG. 4E, the mold layer pattern 313 and the second insulation layer pattern 312 are removed to expose the first insulation layer pattern 311. As a result, a lower electrode 367 may be formed on the diode 355.

A phase-change material layer (not shown) is formed on the lower electrode 367. The phase-change material layer may include a chalcogenide material. In one embodiment, the phase-change material layer may be provided as exemplarily described with respect to FIG. 3H.

A second conductive layer (not shown) may be formed on the phase-change material layer. The second conductive layer may include a metal, a metal nitride, or the like or a combination thereof. In one embodiment, the second conductive layer may be provided as exemplarily described with respect to FIG. 3H.

A second mask (not shown) may be formed on the second conductive layer. The second conductive layer and the phase-change material layer may be partially etched using the second mask as an etching mask to form an upper electrode 390 and a phase-change material layer pattern 380, respectively, on the lower electrode 367.

Accordingly, the lower electrode 367, the phase-change material layer pattern 380 and the upper electrode 390 may be sequentially formed on a switching device to thereby manufacture a phase-change memory device.

According to the present invention, an amorphous silicon layer is formed by a CVD process and the amorphous silicon layer is crystallized to form a polysilicon layer. Conventionally, a polysilicon layer is formed by a SEG process using a seed layer. Thus, defects formed in the polysilicon layer due to damage in the seed layer, which have been generated in the conventional method, may not be generated in the polysilicon layer formed by crystallizing an amorphous silicon layer. Additionally, the crystallization process is performed at a relatively low temperature such that a thermal budget for adjacent circuit elements may be reduced. Furthermore, leakage currents may be decreased in a diode formed using the polysilicon layer.

What follows in the paragraphs below is a description of some example embodiments of the present invention. It will be appreciated that this discussion is illustrative and non-limiting. In accordance with example embodiments of the present invention, there is provided a method of forming a vertical diode. In the method, an insulating structure having an opening therethrough is formed on a substrate, and an amorphous silicon layer is then formed to fill the opening. A metal silicide layer is formed to contact at least a portion of the amorphous silicon layer. The amorphous silicon layer is crystallized using the metal silicide layer to form a polysilicon layer in the opening. Impurities are implanted into the polysilicon layer to form a doped polysilicon layer.

Here, the metal silicide may be formed using nickel, palladium, titanium, copper, etc. The amorphous silicon layer may be crystallized by a heat treatment process at a temperature of about 400° C. to about 500° C. In an example embodiment, first impurities may be implanted into the amorphous silicon layer, and second impurities may be implanted into an upper portion or a lower portion of the polysilicon layer by an ion implantation process. Here, the second impurities may have a type of conductivity different from that of the first impurities. In an example embodiment, when the impurities are implanted into the polysilicon layer, first impurities may be implanted into a lower portion of the polysilicon layer, and second impurities may be implanted into an upper portion of the polysilicon layer. Similarly, the second impurities may have a type of conductivity different from that of the first impurities. When the metal silicide layer is formed to make contact with the amorphous silicon layer, a metal layer pattern may be formed on a sidewall of the opening, and the metal layer pattern may be reacted with the amorphous silicon layer. In an example embodiment, the metal layer pattern may be reacted with the amorphous silicon layer at a temperature of about 300° C. to about 400° C.

In some example embodiments, when the amorphous silicon layer filling the opening is formed and the metal silicide layer making contact with the amorphous silicon layer is formed, a metal layer pattern may be formed on a sidewall of the opening, the amorphous silicon layer may be formed on the metal layer pattern and the substrate to fill the opening, and the metal layer pattern may be reacted with the amorphous silicon layer. In an example embodiment, when the metal layer pattern is formed on the sidewall of the opening, a metal layer may be formed on a bottom and the sidewalls of the opening and the metal layer may be anisotropically etched.

In example embodiments, when the amorphous silicon layer filling the opening is formed and the metal silicide layer making contact with the amorphous silicon layer is formed, the amorphous silicon layer may be formed to fill the opening, a metal layer may be formed on the amorphous silicon layer, and the metal layer may be reacted with the amorphous silicon layer.

In accordance with some example embodiments of the present invention, there is provided a method of manufacturing a semiconductor device. In the method, an insulation layer structure pattern is formed on a substrate including a lower structure. Here, the insulation layer structure pattern may have an opening exposing a contact region of the lower structure. A metal layer is formed on a sidewall of the opening. An amorphous silicon layer doped with first impurities is formed. Here, the amorphous silicon layer may partially fill the opening. The metal layer is reacted with the amorphous silicon layer to form a metal silicide layer. The amorphous silicon layer is crystallized using a metal atom from the metal silicide layer to form a polysilicon layer in the opening. Second impurities are implanted into the polysilicon layer to form a doped polysilicon layer in the opening. Here, the second impurities may have a type of conductivity different from that of the first impurities. A lower electrode is formed on the doped polysilicon layer.

When the lower electrode is formed on the doped polysilicon layer, a spacer may be formed on an upper sidewall of the opening, a conductive layer may be formed on the doped polysilicon layer to fill a remaining portion of the opening, and the conductive layer is planarized by a planarization process. For example, the metal layer may be formed using nickel, palladium, titanium, copper, etc. In an example embodiment, the amorphous silicon layer may be formed by a chemical vapor deposition (CVD) process, a plasma-enhanced chemical vapor deposition (PECVD) process, a low-pressure chemical vapor deposition (LPCVD) process, etc. In an example embodiment, the metal layer may be reacted with the amorphous silicon layer to form the metal layer into the metal silicide layer by a heat treatment process at a temperature of about 300° C. to about 400° C. In an example embodiment, the amorphous silicon layer may be crystallized using the metal silicide layer by the heat treatment process at a temperature of about 400° C. to about 500° C.

In example embodiments, to manufacture the semiconductor device, a phase-change material layer may be further formed on the lower electrode, and an upper electrode may be further formed on the phase-change material layer.

In accordance with other example embodiments of the present invention, there is provided a method of manufacturing a semiconductor device. In the method, an insulation layer structure pattern is formed on a substrate including a lower structure. Here, the insulation layer structure pattern may have an opening exposing a contact region of the lower structure. An amorphous silicon layer is formed to fill the opening, and a metal layer is formed on the insulation layer structure pattern and the amorphous silicon layer. The amorphous silicon layer is crystallized using the metal layer to form a polysilicon layer in the opening. Impurities are implanted into the polysilicon layer to form a doped polysilicon layer in the opening. A lower electrode is formed on the doped polysilicon layer.

When the amorphous silicon layer is crystallized using the metal layer, the metal layer is transformed into the metal silicide layer by a first heat treatment process at a first temperature. The metal silicide layer and the amorphous silicon layer are heated by a second heat treatment process at a second temperature higher than the first temperature. For example, the first temperature may be in a range of about 300° C. to about 400° C. and the second temperature may be in a range of about 450° C. to about 550° C.

According to the present invention, an amorphous silicon layer is formed by a CVD process and the amorphous silicon layer is crystallized to form a polysilicon layer, while a polysilicon layer is formed by a SEG process using a seed layer in the conventional method. Thus, defects of the polysilicon layer due to damages to the seed layer, which have been generated in the conventional method, may not be generated in the polysilicon layer. Additionally, the crystallization process is performed at such a relatively low temperature that a thermal budget for adjacent circuit elements may be reduced. Furthermore, leakage currents may be decreased in a diode formed using the polysilicon layer.

The foregoing is illustrative of the present invention as recited in the claims, and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included therein.

What is claimed is:

1. A method of manufacturing a semiconductor device, the method comprising:
    forming an insulation layer structure pattern having an opening therethrough on a substrate having a lower structure, the opening exposing a contact region of the lower structure;
    forming a metal layer on a sidewall of the opening;
    forming an amorphous silicon layer doped with first impurities, the amorphous silicon layer partially filling the opening;
    reacting a portion of the metal layer with the amorphous silicon layer to form a metal silicide layer;
    crystallizing the amorphous silicon layer, using the metal silicide layer, to form a polysilicon layer in the opening;
    implanting second impurities into the polysilicon layer to form a doped polysilicon layer in the opening, the second impurities having a type of conductivity different from that of the first impurities; and
    forming a lower electrode on the doped polysilicon layer.

2. The method of claim 1, wherein forming the lower electrode on the doped polysilicon layer comprises:
    forming a spacer on an upper sidewall of the opening;
    forming a conductive layer on the doped polysilicon layer to fill a remaining portion of the opening; and
    planarizing the conductive layer.

3. The method of claim 1, wherein the metal layer is formed using at least one selected from the group consisting of nickel, palladium, titanium and copper.

4. The method of claim 1, wherein forming the amorphous silicon layer is performed by one of a chemical vapor deposition (CVD) process, a plasma-enhanced chemical vapor deposition (PECVD) process, a low-pressure chemical vapor deposition (LPCVD) process, and a combination thereof.

5. The method of claim 1, wherein reacting the metal layer with the amorphous silicon layer to form the metal silicide layer is performed by a heat treatment process at a temperature of about 300° C. to about 400° C.

6. The method of claim 1, wherein crystallizing the amorphous silicon layer using the metal silicide layer to form the polysilicon layer is performed by a heat treatment process at a temperature of about 400° C. to about 500° C.

7. The method of claim 1, further comprising:
    forming a phase-change material layer on the lower electrode; and forming an upper electrode on the phase-change material layer.

* * * * *

UNITED STATES PATENT AND TRADEMARK OFFICE
CERTIFICATE OF CORRECTION

PATENT NO. : 8,241,979 B2
APPLICATION NO. : 12/805825
DATED : August 14, 2012
INVENTOR(S) : Sang-Jin Park et al.

Page 1 of 1

It is certified that error appears in the above-identified patent and that said Letters Patent is hereby corrected as shown below:

Title page, item (62) should read as follows:

Related U.S. Application Data

(62) Division of Application No. 12/034,440, filed on Feb. 20, 2008, now Pat. No. 7,803,679.

Title page, item (30) should read as follows:

(30) Foreign Application Priority Data

Feb. 21, 2007   (KR)...................... 2007-0017451

On column 1 line 9, "35 U.S.C. § 119" should be replaced with "35 U.S.C. § 120".

Signed and Sealed this
First Day of January, 2013

David J. Kappos
*Director of the United States Patent and Trademark Office*